(12) United States Patent
Laming et al.

(10) Patent No.: US 8,643,129 B2
(45) Date of Patent: Feb. 4, 2014

(54) MEMS DEVICE

(75) Inventors: Richard Ian Laming, Edinburgh (GB); Mark Begbie, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 518 days.

(21) Appl. No.: 12/293,537

(22) PCT Filed: Mar. 20, 2007

(86) PCT No.: PCT/GB2007/000971
§ 371 (c)(1),
(2), (4) Date: Sep. 18, 2008

(87) PCT Pub. No.: WO2007/107735
PCT Pub. Date: Sep. 27, 2007

(65) Prior Publication Data
US 2009/0278217 A1  Nov. 12, 2009

(30) Foreign Application Priority Data

Mar. 20, 2006  (GB) .................................. 0605576.8

(51) Int. Cl.
*H01L 29/84* (2006.01)
(52) U.S. Cl.
USPC ........... 257/419; 257/415; 257/416; 257/417; 257/418; 257/420; 438/50; 438/52
(58) Field of Classification Search
USPC ................. 257/415–420; 438/50, 52
See application file for complete search history.

(56) References Cited

U.S. PATENT DOCUMENTS

| | | | |
|---|---|---|---|
| 4,776,019 A | 10/1988 | Miyatake | |
| 6,535,460 B2 * | 3/2003 | Loeppert et al. | 367/181 |
| 2005/0241944 A1 | 11/2005 | Dehe et al. | |

FOREIGN PATENT DOCUMENTS

| | | | |
|---|---|---|---|
| CN | 1564334 A | | 1/2005 |
| DE | 37 15 999 A1 | | 12/1987 |
| EP | 758080 A1 | * | 2/1997 |
| EP | 1 193 215 A2 | | 4/2002 |
| JP | 2000214035 A | * | 8/2000 |
| WO | WO 02/15636 | | 2/2002 |
| WO | WO 03045110 A1 | * | 5/2003 |
| WO | WO 03/068668 A2 | | 8/2003 |
| WO | WO 2006/123263 | | 11/2006 |

OTHER PUBLICATIONS

Pedersen et al., "A Silicon Condenser Microphone With Polyimide Diaphragm and Backplate" Sensors and Actuators A, 63, pp. 97-104, (1997).

* cited by examiner

*Primary Examiner* — Matthew W Such
*Assistant Examiner* — Robert Carpenter
(74) *Attorney, Agent, or Firm* — Dickstein Shapiro LLP

(57) ABSTRACT

A micro-electrical-mechanical device comprises: a transducer arrangement having at least a membrane being mounted with respect to a substrate; and electrical interface means for relating electrical signals to movement of the membrane; in which the transducer arrangement comprises stress alleviating formations which at least partially decouple the membrane from expansion or contraction of the substrate.

25 Claims, 10 Drawing Sheets

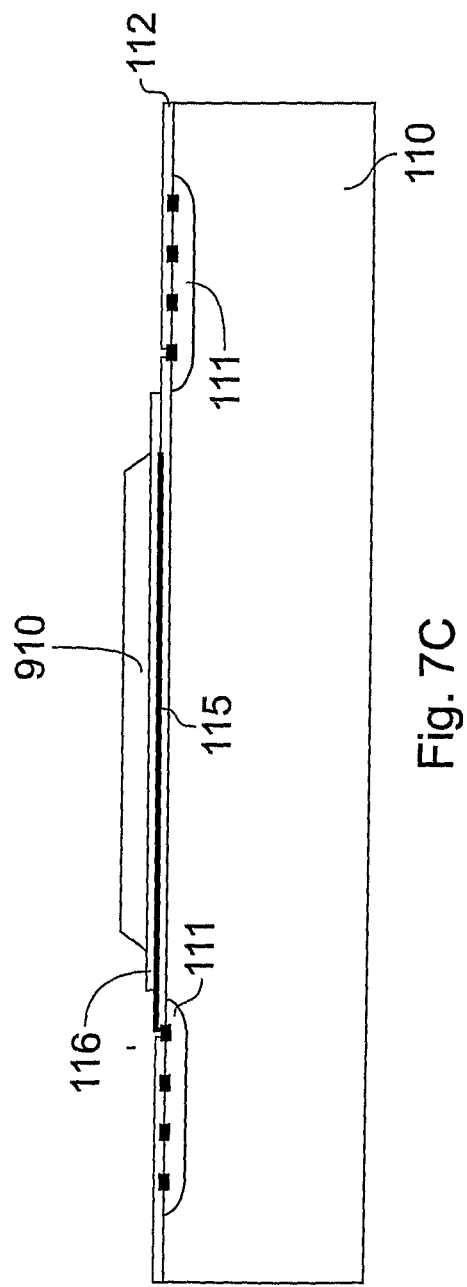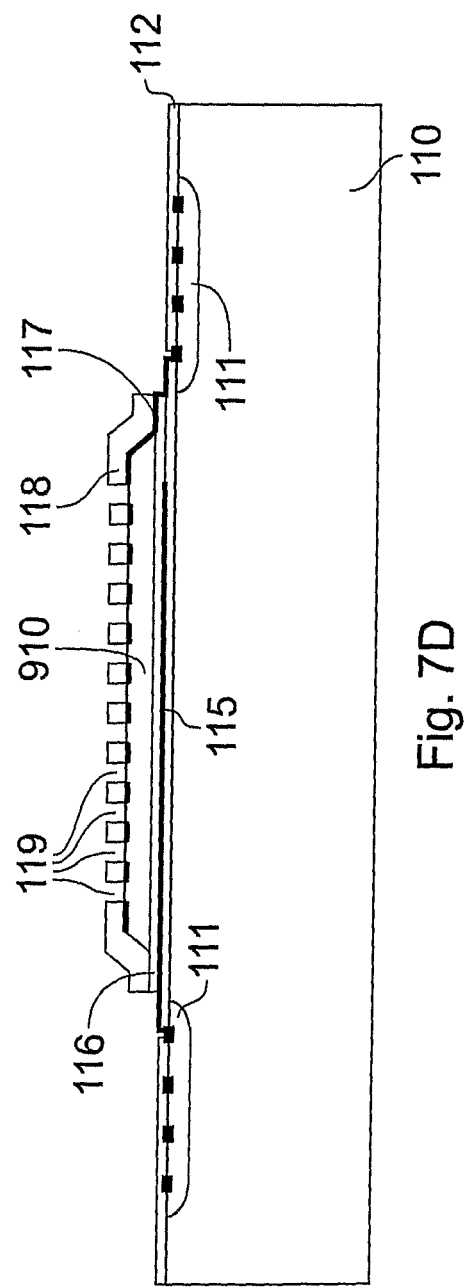

MEMS DEVICE

This invention relates to MEMS devices.

Consumer electronics devices are continually getting smaller and, with advances in technology, are gaining ever increasing performance and functionality. This is clearly evident in the technology used in consumer electronic products such as mobile phones, laptop computers, MP3 players and personal digital assistants (PDAs). Requirements of the mobile phone industry for example, are driving the components to become smaller with higher functionality and reduced cost. It is therefore desirable to integrate functions of electronic circuits together and combine them with transducer devices such as microphones and speakers.

The result of this is the emergence of micro-electrical-mechanical-systems (MEMS) based transducer devices. These may be for example, capacitive transducers for detecting and/or generating pressure/sound waves or transducers for detecting acceleration. There is a continual drive to reduce the size and cost of these devices through integration with the electronic circuitry necessary to operate and process the information from the MEMS through the removal of the transducer-electronic interfaces. One of the challenges in achieving these goals is ensuring that the performance of the integrated devices remain constant over widely varying operating conditions. In particular, it is important that a device be relatively insensitive to changes in condition over a wide temperature range as this greatly affects the sensitivity/performance of the device. In addition, it is difficult to achieve compatibility with standard processes used to fabricate complementary-metal-oxide-semiconductor (CMOS) electronic devices during manufacture of MEMS devices. This is required to allow integration of MEMS devices directly with conventional electronics using the same materials and processing machinery. This invention seeks to address these two areas.

Miniature micro machined silicon microphones are well known in the art. Their operating principle is based on a small flexible diaphragm or membrane which deflects in response to acoustic pressure. The membrane is typically conductive or includes an electrode. The small deflection of the membrane is typically detected with a closely coupled rigid perforated back-plate conductor which forms a variable capacitor with the membrane. The capacitance between the membrane and the back-plate conductor is measured and this forms the output of the transducer. The sensitivity of the transducer is dependent on the stiffness of the membrane; a less stiff membrane will deflect more in response to acoustic pressure and so give rise to a larger change in capacitance. The sensitivity of the transducer to changes in temperature thus depends on the variation in stiffness of the membrane as a function of temperature.

The capacitance of a typical transducer is in the range 1-10 pF. However, the variation in capacitance due to audio voice signals is approximately five orders of magnitude lower. To measure the capacitance, a bias voltage (for example 10V) is applied to one electrode of the microphone. The other electrode is connected to a high impedance (~10 G$\Omega$) pre-amplifier. The bias voltage establishes a charge on the capacitor due to the relationship between charge Q, capacitance C and voltage V given by Q=CV. The typical time scales associated with audio frequencies are generally far shorter than the charge dissipation time of the capacitor and so the charge Q can be considered to be constant. This means that any changes in distance, in response to sound waves, between the electrodes is reflected by a change in potential across the electrodes and this is measured by the pre-amplifier.

Due to the small change in capacitance in response to audio voice signals it is important to make high sensitivity devices. Therefore, amongst other things, stray capacitance between circuit components and the transducer should be avoided. In addition, it is desirable to directly integrate the transducer with electronics to realise compact and low-cost devices. It is also desirable for a fully integrated device to have a capability for digital processing. In order to achieve this, it is necessary to fabricate the transducer using processes and materials that are compatible with processes and materials used in the manufacture of electronic elements, in particular CMOS devices. For example, this means avoiding gold as it can contaminate and destroy performance of the junctions, using common materials and processes and avoiding subjecting the device to process temperatures above 400° C.

Several variants of membrane suspension and configuration are known. The design chosen greatly effects the resultant sensitivity of the fabricated transducer.

In a previously known implementation of a MEMS microphone by Kabir et al (reference 1), the membrane is made from thick silicon that is loosely sprung at the edges. Here, the membrane moves in a piston-like motion and the sensitivity is dependent on the inertial mass of the membrane and the stiffness of the sprung edges. However, in this implementation, the membrane is quite thick thus leading to poor sensitivity. In addition, the gold back plate precludes direct integration with CMOS fabrication processes in a commercial foundry.

In another previously known implementation Scheeper et al (reference 2) disclose a MEMS microphone in which the membrane is held in tension like a drum skin. The sensitivity is thus dependent on the membrane tension and thickness. A silicon nitride membrane is used but, given its size, the sensitivity of the microphone is low due to membrane stress, the density of air holes in the back plate and a thin back plate.

Pedersen et al (reference 3) demonstrated a microphone integrated with CMOS electronics. Here, polyimide was employed for the membrane and back plate material. This allows stress to be reduced in the membrane. In addition, the thickness of the back plate was increased to increase its stiffness. However, polyimide exhibits a large thermal coefficient of expansion and is not a preferred reliable material for device fabrication.

Another implementation of using a silicon nitride membrane in a MEMS microphone is disclosed by Cunningham et al (reference 4). Here, the outer portion of the membrane is corrugated to release inherent stress and create a loosely coupled diaphragm. Fabricating the membrane in this fashion is expensive as it requires additional processing steps.

The microphone disclosed by Loeppert et al (reference 5) uses an alternative approach to the ones described above as the membrane is free floating and designed to be stress free. It is subsequently clamped to a support ring due to electrostatic forces on operation of the device. The sensitivity is dependent on the thickness of the membrane and on material parameters. However, the fabrication process is more complex and hence more expensive. In addition, the membrane cannot be made as thin as a tensioned membrane as it has to be made robust enough to be free floating. Although the membrane itself is stress free, if required the deposition of an electrode on the membrane can induce differential stress which limits the sensitivity of the microphone.

According to a first aspect of the present invention, there is provided a micro-electrical-mechanical device comprising: a transducer arrangement having at least a membrane being mounted with respect to a substrate; and electrical interface means for relating electrical signals to movement of the membrane; in which the transducer arrangement comprises stress alleviating formations within the perimeter of the membrane which at least partially decouple the membrane from expansion or contraction of the substrate.

Thus, according to embodiments of the present invention stress alleviating formations are provided within the perimeter of the membrane and do not break/disrupt the perimeter of the membrane.

Preferably, the stress alleviating formations comprise holes which extend through the plane of the membrane. Alternatively, the stress alleviating formations comprise trenches, i.e. areas of reduced membrane thickness, which extend only part way through the plane of the membrane. The stress alleviating formations may therefore be said to be in-plane with the membrane. According to one embodiment, there may comprise a covering layer, or layers, which covers or seals the in-plane stress alleviating formations. For example, the membrane may be provided with a plurality of holes or trenches which are sealed with a thin metal layer. The effect of this covering layer is to restrict or stop the airflow.

The stress alleviating formations may be comprised within a stress release region which extends up to the perimeter of the membrane. Preferably, the membrane is mounted with respect to the substrate so that the stress release region at least partially overlaps with the substrate. Thus, it is preferable for the stress release region to at least partially project over the substrate.

According to a second aspect of the present invention there is provided a micro-electrical-mechanical device comprising: a transducer arrangement having at least a membrane being mounted with respect to a substrate; and electrical interface means for relating electrical signals to movement of the membrane, in which the membrane has a thermal expansion coefficient that is closely matched with a thermal expansion coefficient of silicon.

The transducer arrangement may comprise a composite membrane structure which is fabricated from a plurality of materials. For example, the composite structure may comprise a layered sandwich structure comprising, for example metal/nitride/metal or nitride/metal/nitride which includes the first electrode. According to this embodiment, the composite structure is preferably provided only in the region of the electrode. One such structure could comprise an aluminium/silicon nitride/aluminium sandwich, for example with dimensions of approximately ~50/400/50 nm, so that the expansion/stress mismatch between the aluminium and silicon nitride is balanced top and bottom and thus minimises the chance of the membrane becoming "domed" due to the differential layer stresses. Alternatively the aluminium electrode can be buried between two silicon nitride layers to form a sandwich structure with approximate dimensions of, for example, 200/50/200 nm. Thus, according to this aspect of the present invention, the thermal expansion coefficients of the major materials comprising the composite structure are selected in order to try to match the combined thermal expansion coefficient of the composite structure with silicon.

According to a third aspect of the present invention, there is provided a micro-electrical-mechanical device comprising: a transducer arrangement having at least a membrane being mounted with respect to a substrate; and electrical interface means for relating electrical signals to movement of the membrane, wherein the transducer arrangement further comprises a back-plate arrangement having another electrical interface means for relating electrical signals to the movement of the membrane, the backplate arrangement being positioned so as to form a cavity between the back-plate arrangement and the membrane, wherein a measure of the stiffness of the backplate arrangement is at least ten times greater than a measure of the stiffness of the membrane.

According to a fourth aspect of the present invention, there is provided a micro-electrical-mechanical device comprising: a transducer arrangement having at least a membrane being mounted with respect to a substrate; and electrical interface means for relating electrical signals to movement of the membrane, further comprising stress decoupling means which serves to at least partially decouple the transducer arrangement from the substrate. According to one embodiment of this aspect, the membrane is shaped so as to provide the stress decoupling means. In this respect, the membrane may be mounted with respect to the substrate such that the plane of the membrane is separated from the plane of the upper surface of the substrate. Alternatively, or additionally, the membrane may be shaped such that the profile of the membrane exhibits a trough, or discontinuity, which acts as a stress release section to stress de-couple the transducer from the substrate.

According to a fifth aspect of the present invention, there is provided a micro-electrical-mechanical device comprising: a transducer arrangement having at least a membrane being mounted with respect to a substrate; and electrical interface means for relating electrical signals to movement of the membrane, wherein the membrane is mounted with respect to the substrate such that the plane of the membrane is separated from the plane of the upper surface of the substrate.

According to a further aspect of the present invention, there is provided a micro-electrical-mechanical device comprising: a transducer arrangement having at least a membrane being mounted with respect to a substrate; and electrical interface means for relating electrical signals to movement of the membrane; in which the transducer arrangement comprises stress alleviating formations within the plane of the membrane which at least partially decouple the membrane from expansion or contraction of the substrate.

A device embodying any aspect of the present invention may be provided with electronic circuitry that is operably connected to the electrical interface means to thereby provide an integrated device.

Furthermore, the present invention may provide a MEMS microphone, pressure sensor or ultrasonic transducer comprising a device according to an embodiment of any of the aforementioned aspects.

A preferred embodiment of the present invention provides a micro-electrical-mechanical device comprising: a substrate comprising circuit regions, the substrate and the circuit regions protected by an insulating and protecting layer so as to form a wafer structure, the circuit regions comprising circuit interconnects and the insulating and protecting layer comprising etched interconnect points that substantially correspond with the circuit interconnects; a membrane partially disposed upon the insulating and protecting layer and mechanically joined to a first electrode so as to form a membrane structure having a first side and a second side, the first electrode being operably coupled to one of the circuit regions via one of the etched interconnect points; a perforated backplate mechanically joined to a second electrode so as to form a backplate structure, the back-plate structure being positioned so as to form an air cavity between the back-plate structure and the second side of the membrane structure, the backplate structure and the membrane structure forming a sensor structure and the second electrode being operably coupled to another one of the circuit regions via another one of the etched interconnect points; and a hole formed through the wafer structure such that the hole substantially corresponds with the first side of the membrane structure, in which the membrane structure has in-plane stress-release holes disposed substantially around the perimeter of the membrane structure.

Various further respective aspects and features of the present invention are defined in the appended claims.

Preferred embodiments of the invention will now be described with reference to the accompanying drawings in which:

FIGS. 7a-7e show fabrication steps used to fabricate the first embodiment.

Figure 1A:
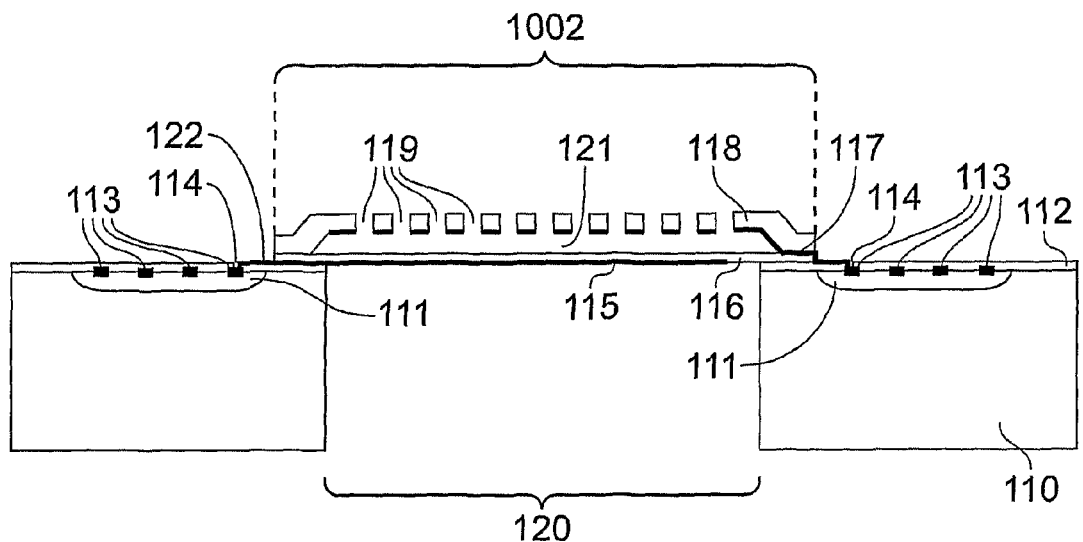
FIGS. 1a and 1b show a schematic view of a first embodiment of the invention in which a MEMS microphone has close matching of a thermal expansion coefficient of a membrane with that of a substrate.

FIG. 1a shows a schematic view of a first embodiment of the invention. It shows a cross-sectional view of a MEMS device that operates as a capacitively coupled microphone 1002. The device is fabricated from a silicon substrate 110 (In this example, for integration with CMOS electronics the substrate is silicon, but it will be appreciated that other substrate materials and electronic fabrication techniques could be used instead.). In order to process an output signal from the microphone 1002, the device is coupled to circuit regions 111 fabricated by standard CMOS processes on the substrate. The circuit regions comprise aluminium circuit interconnects 113 that are used to electrically connect to the microphone via interconnect points 114. To protect the circuit regions from damage, a silica based insulating and protective layer 112 covers the circuit regions and the rest of the substrate 110. The interconnect points 114 are holes that are etched into the silica based insulating and protective layer 112 so as to expose some of the aluminium circuit interconnects.

The microphone 1002 itself is formed from a flexible membrane 116 that is mechanically coupled to a first electrode 115 and a rigid structural back-plate 118 that is mechanically coupled to a second electrode 117. Interposed between the membrane and the backplate is an air gap 121 to allow the membrane to move freely in response to pressure differences generated by sound waves. The first electrode 115 connects to one of the circuit regions 111 via one of the interconnect points 114. The first electrode is mechanically coupled to the membrane 116 which is suspended across a hole 120 in the substrate 110. The hole 120 enables the membrane to move freely in response to pressure differences generated by sound waves. The membrane may be silicon nitride or it may be any other material suitable for use as a membrane in a MEMS device. For example, the membrane may also be polysilicon. Alternatively, the membrane may be part of a sandwich structure comprising metal/nitride/metal or nitride/metal/nitride. The preferred material for the first electrode 115 in the first embodiment is aluminium but a person skilled in the art will realise that the first electrode may comprise any other conductive material e.g. AlSi, AlSiCu, Ti, TiW, Cu, Ni, NiCr, Cr, Pt, Ta or Pd suitable for use as the electrode material.

Suspended above the first membrane 116 and attached to the rigid structural layer or backplate 118 is the second electrode 117. This is mechanically coupled to the backplate and connected to one of the circuit regions 111 via one of the interconnect points 114. The preferred material for the first electrode in the first embodiment is aluminium but a person skilled in the art will realise that the second electrode 117 may comprise any other conductive material e.g. AlSi, AlSiCu, Ti, TiW, Cu, Ni, NiCr, Cr, Pt, Ta or Pd suitable for use as the electrode material. To prevent the formation of a sealed cavity that would impede the microphone from operating correctly, vent holes 119 are arranged in the backplate 118 so as to allow free movement of air molecules.

Figure 1B:
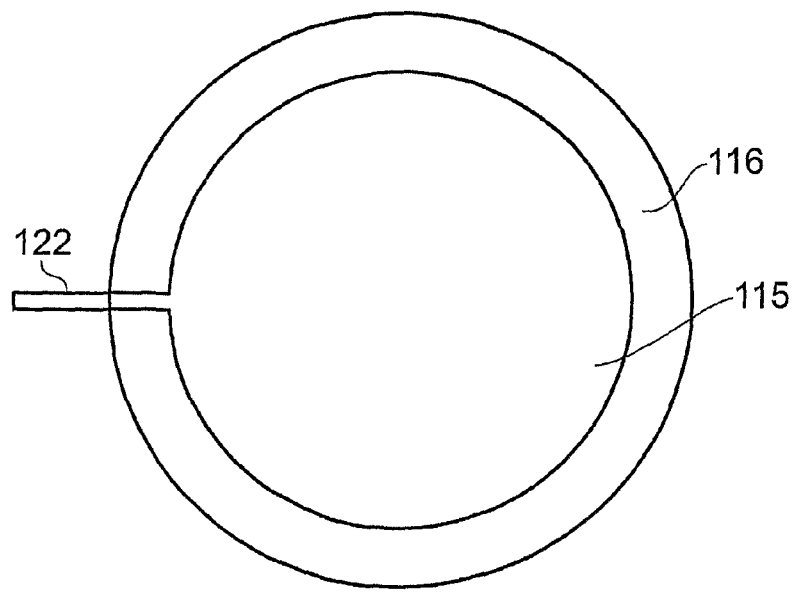

FIG. 1b shows a schematic plan view of the first embodiment of the invention as described above. As can be seen from FIG. 1b, the first electrode 115 does not cover the whole diameter of the membrane 116 as the outer areas of the membrane 116 suffer less movement and thus contribute to a relatively fixed capacitance. In the first embodiment, the electrode diameter is 70%, although electrode dimensions of below 55% are also suitable. Indeed, a person skilled in the art will realise that other values will achieve much the same technical effect. The first electrode is connected to one of the circuit regions 111 via interconnect point 114 using a small electrode tab 122 that extends over the edge of the membrane 116 to connect to one of the aluminium circuit interconnects 113.

The problem of reducing the temperature dependence and increasing the sensitivity of a MEMS microphone is addressed by the first embodiment by carefully controlling the stress in the membrane 116 and closely matching the combined thermal expansion coefficient of the membrane 116 and the first electrode 115 with that of silicon. This is done because differences in the thermal coefficient of expansion of the membrane 116 and the substrate 110 give rise to a temperature dependent stress in the membrane. As the sensitivity of the device is inversely proportional to membrane stress, the sensitivity can be maximised by choosing a relatively low membrane stress. However, in previously known devices a small change in temperature can result in a large change in sensitivity or the membrane tension may be completely released thus rendering the device useless. The membrane structure of the first embodiment seeks to address this problem.

Firstly, process parameters for deposition of the silicon nitride membrane 116 are carefully chosen to control its resultant stress. Aluminium is deposited and patterned to form the resultant first electrode 115 structure. The process parameters are chosen to control the tensile stress of the deposited membrane 116 so that the tensile stress is in the range 5-50 MPa. As the silicon substrate has a thermal expansion coefficient which is typically greater than that of the silicon nitride, the tension of the membrane increases with an increase in temperature for a silicon nitride membrane in the absence of a deposited electrode. In contrast, aluminium and other candidate electrode materials exhibit a higher thermal expansion coefficient than silicon. The first embodiment thus uses a composite membrane in which the combined thermal expansion coefficient of the membrane plus the electrode is more closely matched to the thermal expansion coefficient of silicon. Typical material properties for the preferred materials are listed in table 1 from P. R. Scheeper, "A silicon condenser microphone: materials and technology", ISBN 90-9005899-0, pg. 54.

TABLE 1

|  | Expansion coefficient ($\times 10^{-6}/°$ C.) | Young's Modulus E (GPa) |
|---|---|---|
| Silicon | 3.2 | 180 |
| Silicon Nitride | 1.5 | 110 |
| Aluminium | 24.5 | 70 |

To estimate the respective thickness of the membrane 116 and the first electrode 115 an approximation to the thickness ratio of aluminium ($t_{al}$) to silicon nitride ($t_{sn}$) can be found to be given by $$\frac{t_{al}}{t_{sn}} \approx \frac{(E_{sn}/(1-v_{sn}))(\alpha_{sn}-\alpha_{si})}{(E_{al}/(1-v_{al}))(\alpha_{si}-\alpha_{al})}$$

Here, t is the thickness of the structural element, E is Young's modulus, α is the thermal expansion coefficient, ν is Poisson's ratio and the subscripts al, sn and si denote the materials used in this example i.e. aluminium, silicon nitride and silicon respectively. This implies that the first electrode 115 thickness should be approximately a seventh of the silicon nitride membrane 116 thickness. A more accurate estimation is obtained using numerical simulation taking into account the electrode area and the respective Poisson's ratio of each of the materials. As exact material parameters can depend on the specific processing conditions, these are thus determined experimentally. To avoid bowing due to differential layer stresses a sandwich of either metal/nitride/metal or nitride/metal/nitride can also be employed. In order to ensure optimum sensitivity in the first embodiment, the back plate 118 is typically more than ten times stiffer than the membrane 116. To avoid the back-plate 118 becoming too thick, the back-plate 118 may be fabricated with a higher stress than that of the membrane 116.

The operation of the first embodiment will now be briefly described. In response to a sound wave corresponding to a longitudinal pressure wave incident on the microphone, the lower membrane 116 is deformed slightly from its equilibrium positions. The distance between the lower electrode 115 and upper electrode 117 is correspondingly altered, giving rise to a change in capacitance between the two electrodes that is subsequently detected by the circuit regions 111.

Figure 2A:
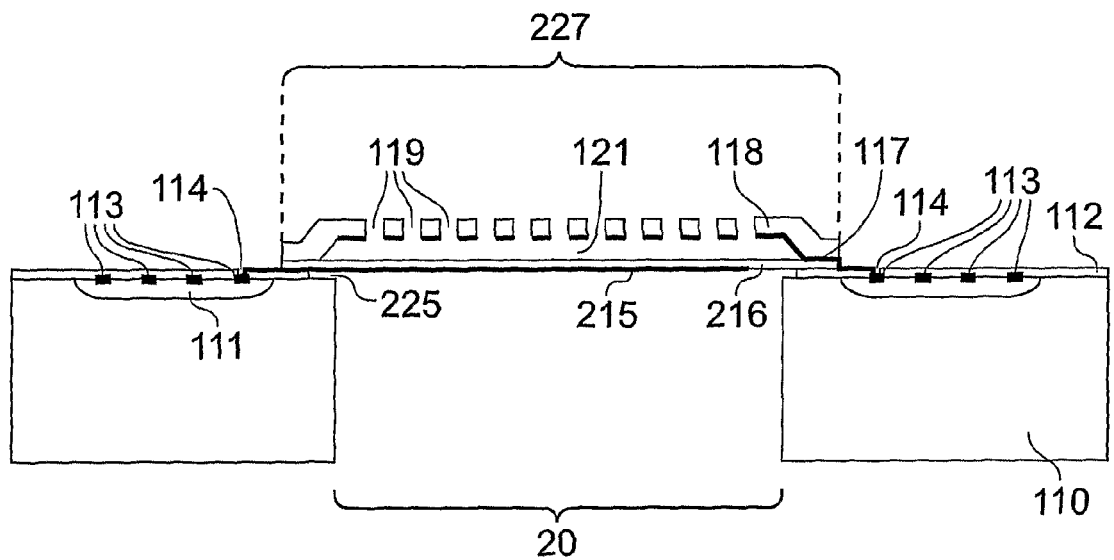
FIGS. 2a and 2b show a schematic view of a second embodiment of the invention in which a MEMS microphone has stress release holes disposed substantially around the perimeter of a membrane structure.
Figure 2B:
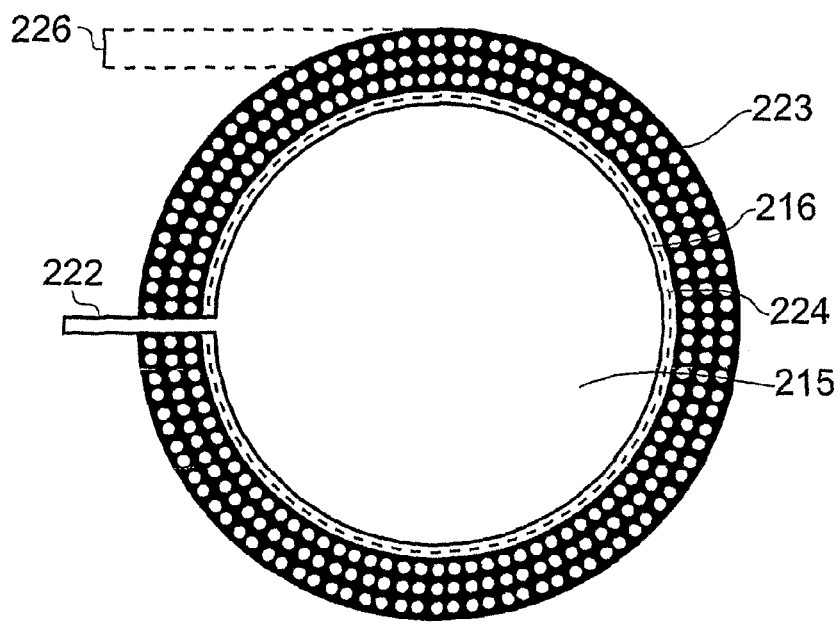

A second embodiment of the invention is shown schematically in FIG. 2a and FIG. 2b. FIG. 2a shows a schematic cross sectional view of a MEMS microphone 227 with high sensitivity and low temperature dependent sensitivity. FIG. 2b is a schematic plan view of the membrane structure of the second embodiment.

The construction of the second embodiment is substantially the same as described in the first embodiment. However, the sensitivity of the microphone 227 is rendered relatively independent of changes in temperature by the addition of controlled stress release structures that are etched in the region of the outer perimeter of a membrane 216. The controlled stress release structures effectively reduce the Young's modulus of this region.

Figure 3:
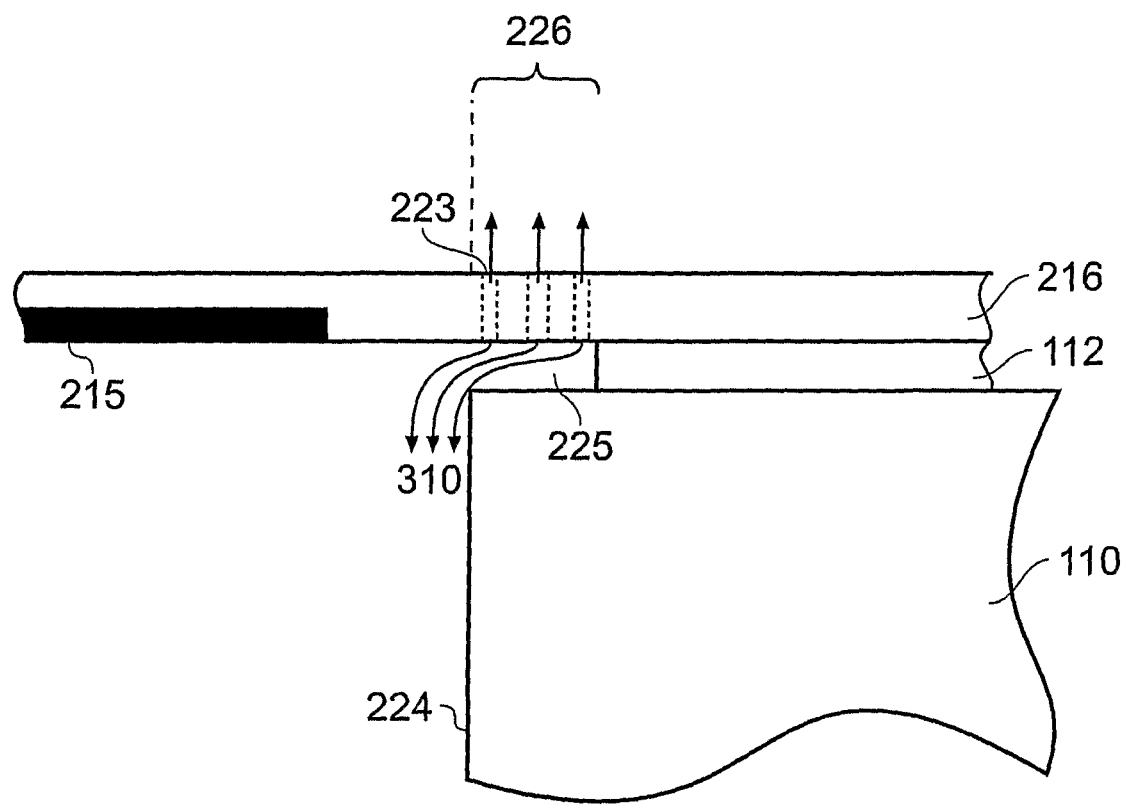
FIG. 3 shows a close-up schematic cross-sectional view of the stress relief holes of the second embodiment.

With reference to FIG. 2b and FIG. 3, a first electrode 215 is mechanically coupled to the membrane 216. The first electrode 215 connects to one of the aluminium circuit interconnects 113 via one of the interconnect points 114 and an electrode tab 222. Stress release holes 223 extend over a small stress release region 226 at the perimeter of the membrane 216 and are in the form of holes etched through the membrane 216. A small region of the insulating and protective layer 112 in the form of a perimeter cavity 225 below the stress release holes 223 is removed in order to damp equalisation air flow 310 through the membrane 216. The membrane 216 is in close proximity to the substrate 110 and this provides the required low frequency response. The stress release region 226 may substantially overlap with the substrate 110 or may extend beyond the edge 224 of the substrate so that the region of the stress release holes at least partly overlaps the hole 120 of the MEMS microphone.

Figure 4:
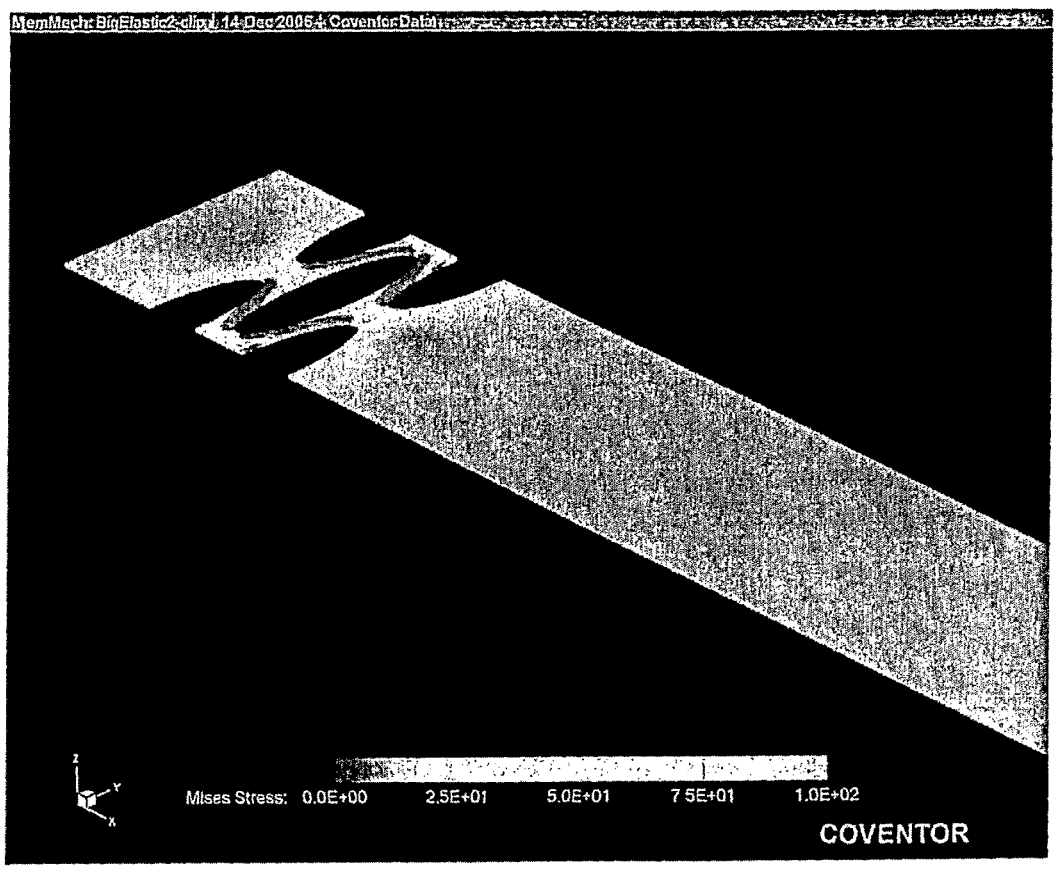
FIG. 4 shows a simulation of stress in a simulated slice of a membrane according to the second embodiment.

A picture of a section of a stress relief hole 223 and a finite element simulation of stress around the stress relief hole 223 is shown in FIG. 4. A stress indication bar at the bottom of the figure indicates the simulated stress which goes from 0 MPa on the left of the bar to 100 MPa on the right. The simulation is for an equivalent slice of the membrane according to the second embodiment. In the simulation, the slice is 500 μm long, 10 μm wide and 0.4 μm thick. However, it will be realised that other dimensions may be used. The simulated slice is fixed at both end faces and symmetry is applied to the edge faces. For the simulation shown in FIG. 4, the stress relief structure comprises three rows of holes. In this simulation of the second embodiment the holes are oval and are 24 μm along the major axis and 6 μm along the minor axis. However, the stress relief holes 223 may also have other shapes suitable to relieve stress in the membrane. For example, they could be circular. In the simulation, it can be seen that the bulk material relaxes to 4 MPa and only increases around the stress relief holes 223. This is in contrast to another simulation (not shown) using identical parameters but without the stress relief holes. In the simulation without the stress relief holes, the stress in the membrane remains the same as when it was deposited which is 25 MPa.

Other empirical simulations show that the stress relief holes 223 reduce the membrane stress by approximately a factor of five, from 100 MPa for a membrane without stress relief holes 223 to a stress of ~20 MPa, for a 0.5 mm diameter membrane with stress relief holes 223. A change in temperature is estimated to increase the stress of a membrane without stress release holes by around ~0.2 MPa/° C. This is reduced to ~0.04 MPa/° C. for a structure in which stress release holes 223 are incorporated leading to greater sensitivity or lower temperature dependent sensitivity. The simulations show that this embodiment of a MEMS microphone device offers a way in which the sensitivity can be increased by approximately a factor of five and the dependence of the sensitivity on temperature dependence of sensitivity may be greatly reduced below that of previously known devices whilst maintaining comparable sensitivity.

Figure 5:
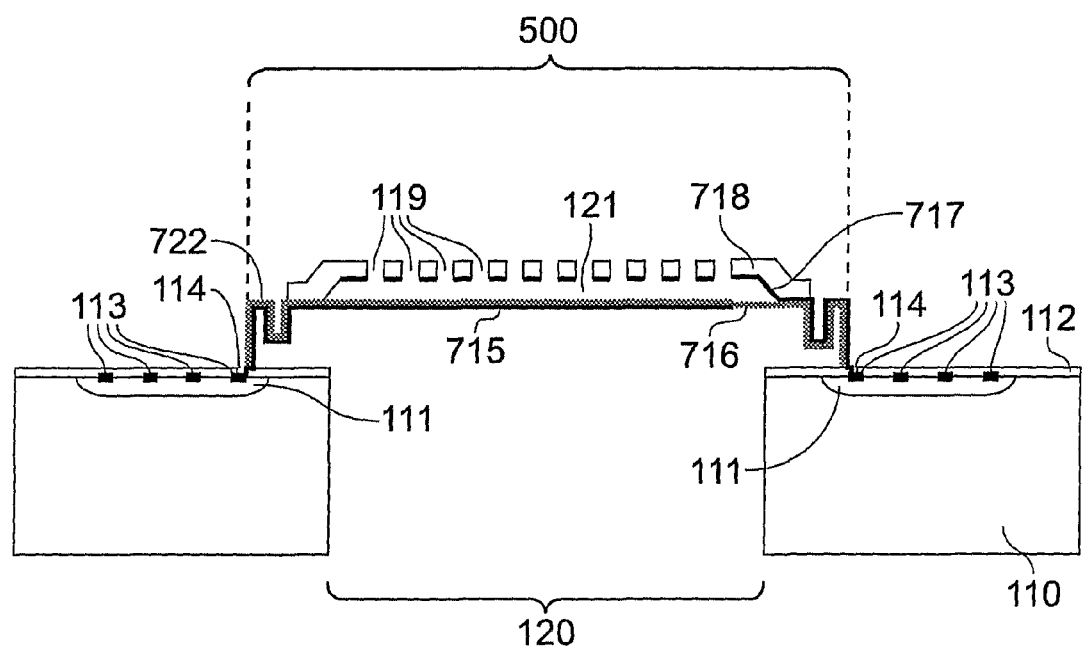
FIG. 5 shows a schematic view of a third embodiment of the invention in which a MEMS microphone has a suspended membrane and back plate structure that is stress de-coupled from a substrate.

A third embodiment of the invention is shown schematically in FIG. 5. A membrane electrode 715 is connected to one of the circuit regions 11 via one of the circuit interconnects 114 and a back-plate electrode 717 is connected to another one of the circuit regions 111 via another circuit interconnect point 114. In this case, a membrane 716 is attached to a structurally strong back plate 718 which is itself stress decoupled from the substrate 110. It can be seen from FIG. 5 that the transducer membrane 716 is mounted with respect to the substrate such that the working plane of the membrane is separated from, i.e. is not contiguous with, the plane of the upper surface of the substrate. Typically the membrane 716 has a thickness in the range 0.3-1 micron and the back plate thickness is in the range of 3 to 10 microns. These thickness parameters ensure the back-plate 718 is sufficiently rigid to support the membrane 716. As also shown in FIG. 5, the back-plate 718 and membrane 716 form a sensor structure which is further stress de-coupled from the substrate 110 by the inclusion of stress release sections 722 between the sensor structure and the substrate 110. The stress release sections 722 are relatively flexible in the x and y horizontal directions, i.e. in the plane of motion of the substrate and hence the plane of thermal expansion/contraction, but are relatively stiff in the vertical z direction so as to maintain high sensitivity. The inclusion of the stress relief sections 722 between the back-plate 718 and the substrate 110 largely eliminates the stress in the back plate so that it can expand and contract freely with temperature. The residual tensional stress of the deposited membrane is typically in the 10-50 MPa range. Due to the matched expansion coefficient of the back-plate 718 and the suspended membrane 716 the dependence of the sensitivity on temperature is greatly reduced.

A process by which the first embodiment may be fabricated will now be described with reference to FIG. 6 and FIGS. 7a to 7e and with reference to elements as disclosed above.

Figure 6:
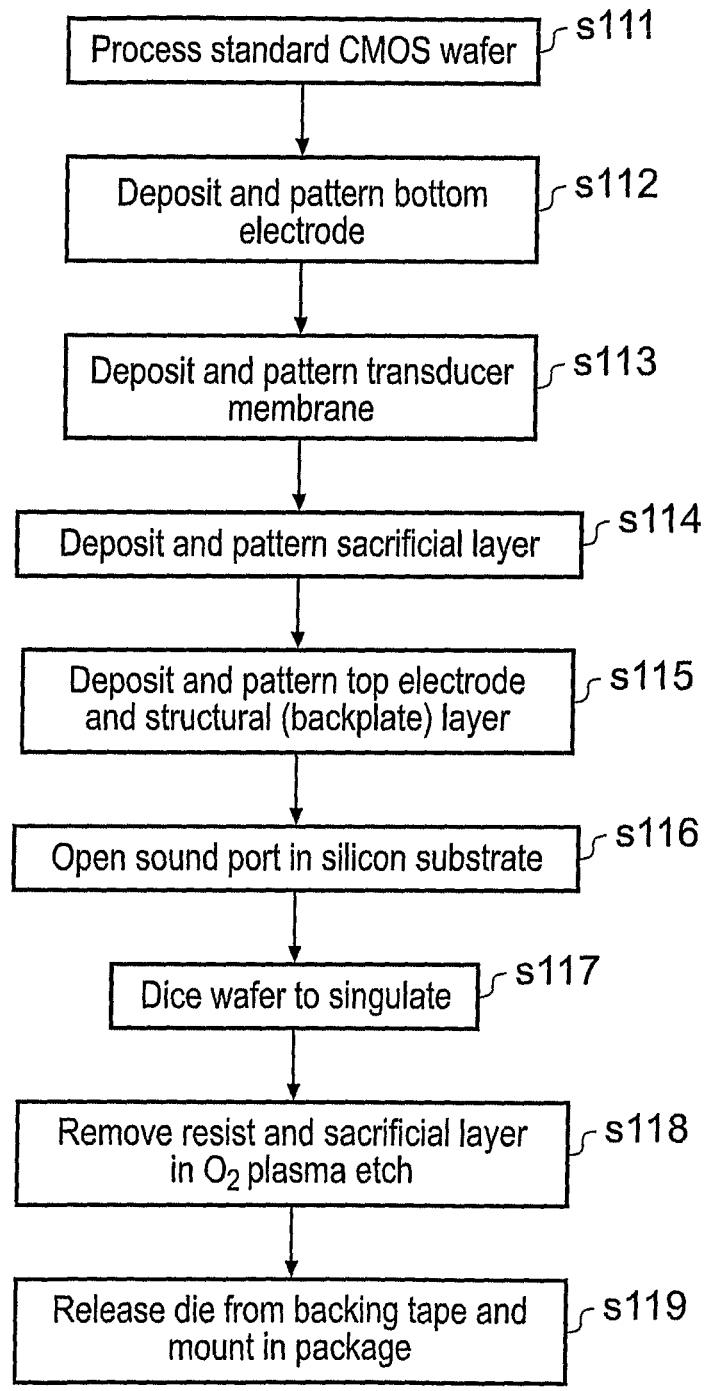
FIG. 6 shows a flow chart of a process used to fabricate the first embodiment.
Figure 7A:
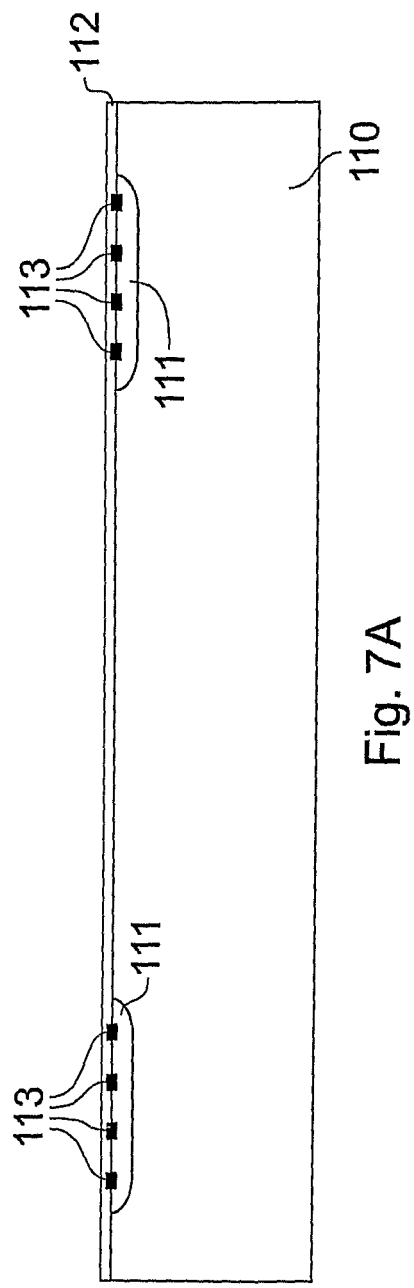

In a step s111 of FIG. 6 and as shown in FIG. 7a, the CMOS silicon wafer or substrate 110 is processed to fabricate the circuit regions 111 using standard processing techniques such as ion implantation, photomasking, metal deposition and etching. The circuit regions 111 comprise any circuit operable to interface with a MEMS microphone. For example, the circuit may be a pre-amplifier connected so as to amplify an output of the microphone. The circuit may optionally comprise an analogue-to-digital converter to convert the output of the microphone or an output of the pre-amplifier into a digital signal. Furthermore, the circuit may comprise any or all of the following: a charge pump; a filter; a multiplexer; a digital signal processor; and a transmitter/receiver suitable for wireless communication. However, it will be appreciated by one skilled in the art that many other circuit arrangements operable to interface with a MEMS microphone may be envisaged.

The aluminium circuit interconnects 113 of the circuit regions 111 are typically made by sputtering aluminium. The aluminium circuit interconnects 113 are then protected from damage by further processing steps with a silica based insulating and protective layer 112. An etch stop layer in the form of, for example, plasma enhanced chemical vapour deposition (PECVD) deposited silicon nitride or silica is included as part of the CMOS fabrication process. (Note that the layer might not be pure silica—BoroPhosphoSilicate Glass or BPSG is a possibility as it can be deposited at lower temperatures).

For the example device the upper electrode 17 and also the electrode 15 below the silicon nitride membrane 16 are aluminium. In this case the electrode could be attacked by the back-hole etching process and so to protect it an etch-stop layer could be included, to be removed later in the process with a simple wet etch process following the hole etch.

Figure 7B:
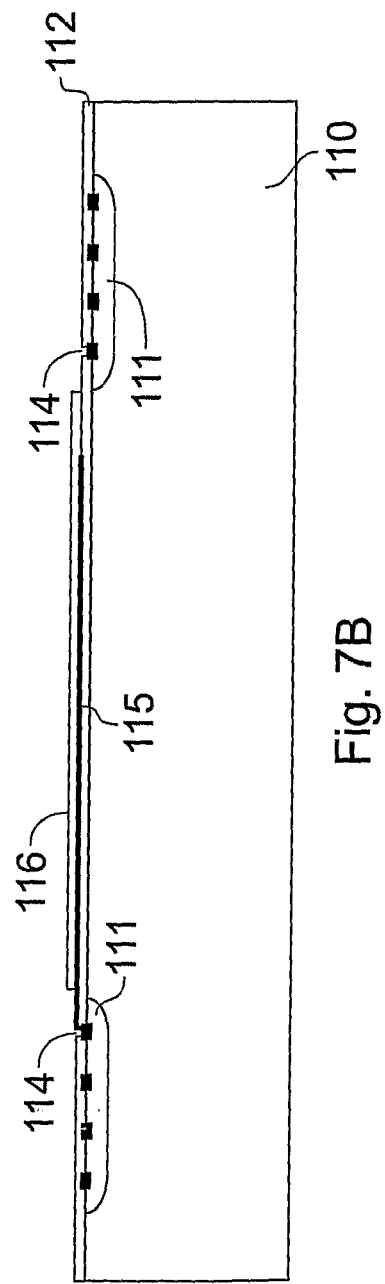
Figure 7E:
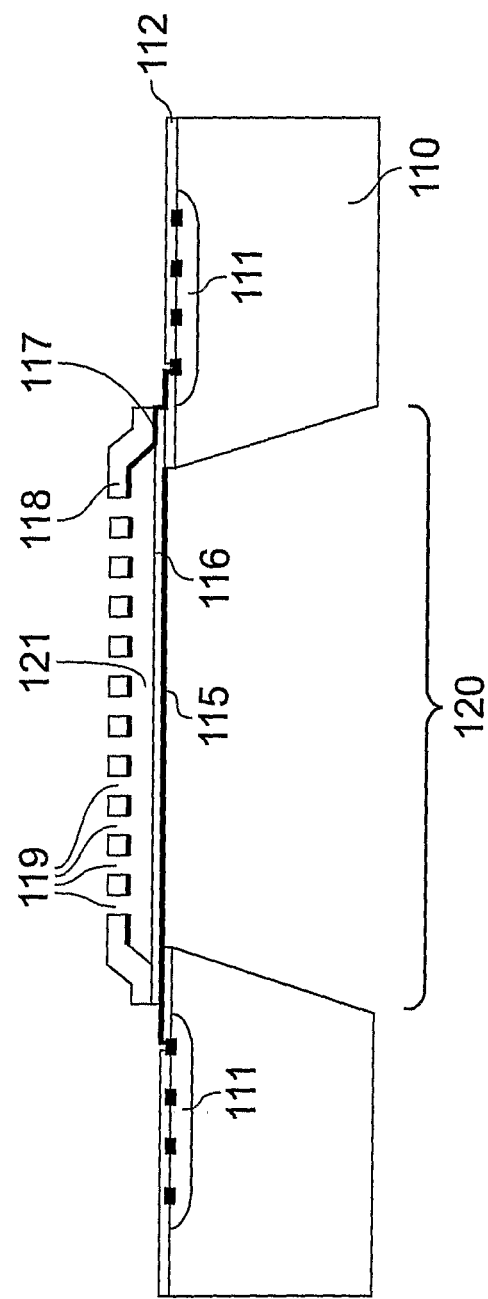

To enable electrical contact to be made between the MEMS microphone and the circuit regions 111, contact points are opened up in the doped silica layer by patterning with resist and dry etching through using a $CF_4/H_2$ gas mix to expose the interconnect points 114 as shown in FIG. 7b.

At a step s112 the bottom electrode 115 is deposited, typically by sputtering pure aluminium using an Oxford Plasma Lab machine set to 1000 W, 2.7 mTorr pressure and an argon flow rate of 50 standard-cubic-centimetres-per-minute (sccm). For a target electrode thickness of 1000 Å the resultant deposited electrode thickness is 976 Å. Alternatively, the bottom electrode 115 may be deposited during the fabrication of the circuit regions 111 at step s111. Depositing the electrode by sputtering is preferable to other methods such as thermal evaporation due to the low substrate temperatures used. This ensures compatibility with CMOS fabrication processes. In addition, where materials other than aluminium are deposited, this method benefits from the ability to accurately control the composition of the thin film that is deposited.

Sputtering deposits material equally over all surfaces so the deposited thin film has to be patterned by photolithography to define the shape of the lower electrode 115. A photosensitive resist (Shipley SPR350) is spun onto the wafer at 2500 rpm in a Brewer Science CEE 6000 wafer track machine and then the wafer undergoes a soft bake (SB) at 90° C. The wafer is then exposed with the desired electrode pattern and undergoes a post exposure bake (PEB) at 110° C. It is then developed using MF-26A developer. To actually define the first electrode 115, the surplus aluminium is etched away from the exposed areas of the wafer in a Plade Wet Deck for 60 seconds at 50° C. using Rockwood Al etch. A person skilled in the art will realise that these parameters and process conditions are exemplary only and any process parameters suitable for carrying out CMOS compatible photolithography and etching may be used. For example, the electrode material may also be Al, AlSi, AlSiCu, Ti, TiW, Cu, Ni, NiCr, Cr, Pt, Ta or Pd. The lower membrane 116 is then deposited at a step 113 and as shown in FIG. 7b via plasma enhanced chemical vapour deposition (PECVD). A mixture of gas flows, pressure, temperature, RF and DC bias is employed to obtain the target composition and stress characteristics. The lower membrane 16 is deposited at 300° C. with Silane ($SiH_4$), Ammonia ($NH_3$) and nitrogen ($N_2$) with flow rates of 40, 40 and 1400 sccm (standard cubic centimetres/minute) respectively. The RF power can be 20 W and can be alternated every 6 seconds between a high frequency (13.56 MHz) and a low frequency (400 kHz) to control the stress in the membrane. To define the shape of the lower membrane 16 it is patterned by photoresist and dry etched using $CF_4/H_2$ gases. The lower membrane 116 may be, for example, silicon nitride or polysilicon.

In order to create the suspended back-plate 118, a sacrificial layer 910 is used in the microphone manufacturing process. This layer is deposited as shown in FIG. 7c and then removed at step s119 in order to define a cavity 121. To ensure compatibility with CMOS fabrication techniques, the sacrificial layer 910 can be made of a number of materials which can be removed using a dry release process. This is advantageous in that no additional process steps or drying is required after the sacrificial layer is released. Polyimide is preferable as the sacrificial layer as it can be spun onto the substrate easily and removed with an $O_2$ plasma clean. During this, oxygen is introduced into a chamber in which the substrate is placed and a plasma set up. The oxygen in the plasma reacts with the organic sacrificial layer to form volatile oxides which can then be removed from the chamber. However, polysilicon may also be used as the sacrificial layer 910.

At a step s114, a layer of polyimide is spun onto the wafer at 3000 rpm for 30 seconds using a CEE 100 Spinner so as to form a conformal coating. It is subsequently cured at 200° C. for 30 minutes in air at atmospheric pressure and then at 300° C. for 30 minutes in a flowing nitrogen environment at atmospheric pressure. The primer used for the polyimide layer is HD VM651 and the sacrificial layer material is Hitachi Dupont polyimide (PI2610). For a target sacrificial layer thickness of 20,000 Å the deposited layer is 21,514 Å. It will be appreciated by a person skilled in the art that the values of these parameters are exemplary only and that any conditions suitable to deposit a polyimide sacrificial layer on a silicon substrate may be envisaged.

A photolithography process is used to define the shape of the sacrificial layer using a Brewer Science CEE 6000 wafer track machine. An IPR206 resist is spun onto the wafer at 700 rpm and undergoes a soft bake at 100° C. There is no post exposure bake and the wafer is developed in MF-26A developer. The exposed areas of the sacrificial layer 910 are removed by reactive ion etching (RIE) in a Plasmatherm RIE machine using 500 W power, 50 mTorr pressure and an oxygen flow rate of 50 sccm. The shape of the sacrificial layer resulting from the etching process defines the shape of the cavity 121 that will be left behind when the sacrificial layer is removed at step s119.

At a step s115 and as shown in FIG. 7*d*, a top electrode 117 and rigid silicon nitride structural layer or back plate 118 are deposited and patterned. The top electrode is deposited by sputtering aluminium using the same parameters as those used to deposit the first electrode 115 in step 112. The back plate 118 is deposited by PECVD in a Surface Technology Systems (STS) PECVD machine at a temperature of 300° C. and 900 mTorr pressure. The silicon nitride is deposited using a mixture of gases which flow through a processing chamber in which the wafer sits. The gases and flow rates used are: $N_2$ at 1960 sccm; $SiH_4$ at 40 sccm; and $N_3$ at 40 sccm. In order to achieve the desired stress, the RF power is 20 W and the frequency is alternated between high frequency (13.56 MHz) and a low frequency (400 kHz). However, it will be appreciated by a person skilled in the art that these gases and parameters are exemplary only. The deposited silicon nitride is then patterned by photolithography and etched as described substantially for step 112 to define vent holes 119 which allow the free passage of air in and out of the cavity so that the lower membrane can flex in response to a sound wave. In order to protect the membranes during subsequent processing stages, the top of the wafer is spun coated s16 with resist which is typically a few microns thick. As well as protecting the membranes from damage, the resist layer prevents the vent holes from being clogged by any debris that might be produced during the singulation process.

Figure 8:
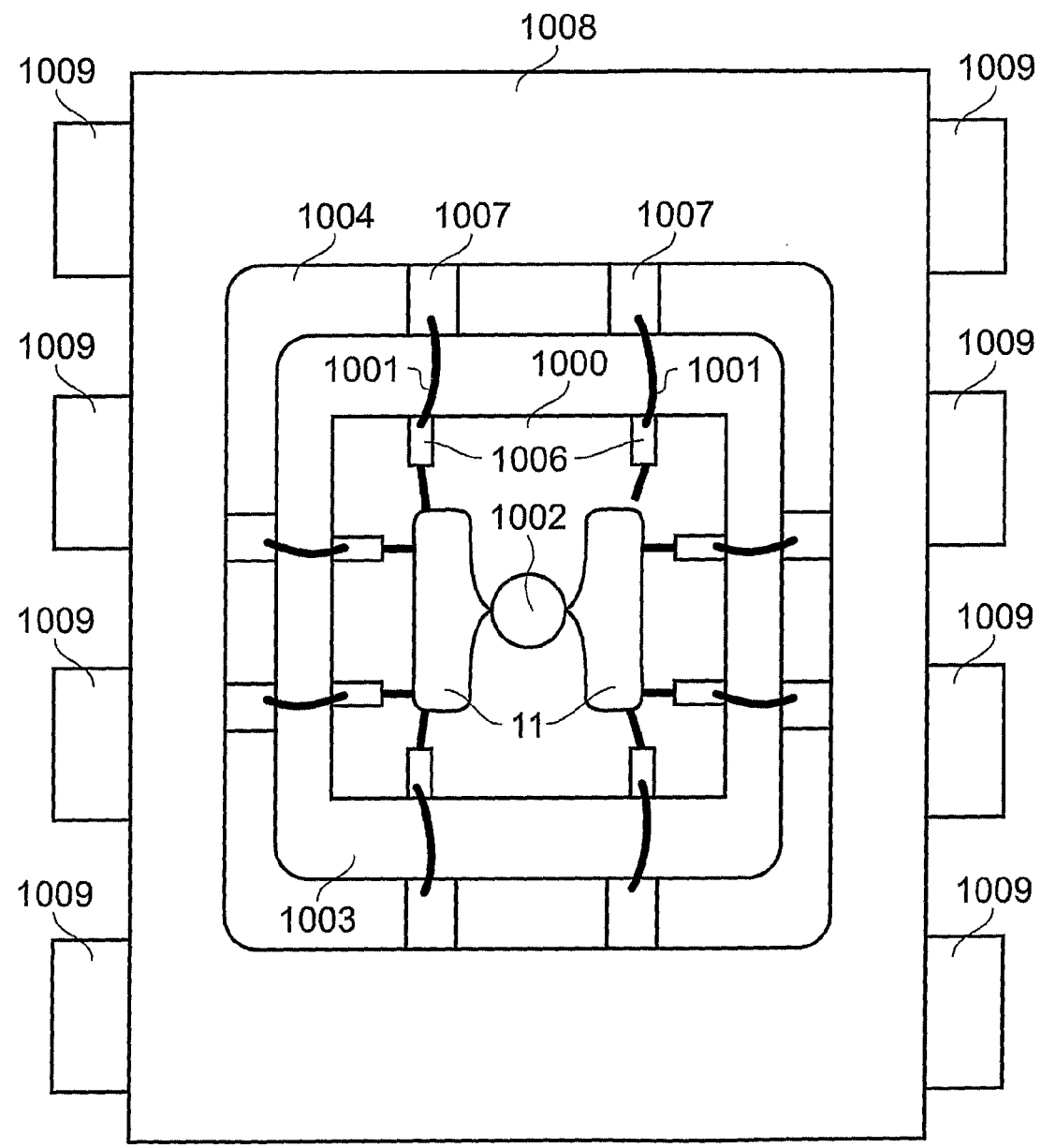
FIG. 8 shows a schematic plan view of the embodiment shown in FIG. 1a and FIG. 1b mounted in a carrier package.

To allow the membrane freedom to flex in response to a sound wave, the side of the substrate that is diametrically opposite from the circuit regions 111 and backplate layer 118 is now patterned with thick (~8 micron) resist and dry etched using a $SF_6/C_4F_8$ gas combination in a reactive ion etch using a Surface Technology Systems Inductively Coupled Plasma (STS ICP) machine to create a sound port hole 120 as shown in FIG. 8 and at a step s116. The reactive ion etch removes the silicon from beneath the membrane but in order to remove the silica based insulating and protective layer 112, an anhydrous HF vapour etch is used. Alternatively the etching of the substrate to form the sound port 20 can be carried out using a wet etch. In this case the back of the wafer is again patterned with resist, and this pattern is then transferred to a thin layer, native thermal oxide or silicon nitride on the back of the wafer and which is not attacked by the wet etch chemical. The mask pattern will typically be square and aligned to the wafer crystal planes. The wet etch is performed using an aqueous solution of 22% tetramethylammonium hydroxide (TMAH) and 78% water and results in a smaller but square opening at the membrane. At a step s117 the substrate containing the silicon MEMS microphones is diced up so that there is only one device (or functional group of devices) per diced piece, in a process known as singulation. Note that in this context a device comprises the MEMS microphone and circuit regions as described above. This is done before the sacrificial layer is removed at a step s118. This embodiment of the method used to fabricate the first embodiment is advantageous in that the sacrificial layer 50 provides mechanical support for the delicate membrane structures during singulation and the resist coat 70 prevents the vent holes 19 from being clogged or damaged by any debris that may be produced in the singulation process.

The method of singulating the substrate can be one of the following: dicing with a high speed diamond blade; laser cutting; or scribing the substrate and cleaving the substrate along a crystallographic orientation. Preferably the singulation is carried out using a Disco DAD 680 wafer saw with a blade width of 30 µm. This is low cost and doesn't heat the substrate as would happen with laser cutting or place too high a stress on the substrate as would occur with the scribe and cleave method. The singulation is carried out by attaching the underneath side of the substrate to a carrier that will be used to support the substrate during singulation. The substrate is typically attached to the carrier using high temperature dicing tape. The dicing tape may be any adhesive tape suitable to survive the process in which the sacrificial layer is removed. During singulation, the intact sacrificial layer 910 provides strength and protection to the membrane layers and the resist layer 70 prevents the vent holes 19 from becoming clogged by debris resulting from the singulation process. After singulation, there is only one device (or functional group of devices) per diced piece which is defined by substantially straight edges.

At step s118 the sacrificial layer is removed in a so-called ashing process. This is where the singulated substrate, still on the dicing tape, is attached to a dicing frame and processed in an $O_2$ plasma system to remove the protective resist and the polyimide. Typically the conditions used for this process are a temperature of 150° C. in an $O_2$ plasma for ~3 hours (40% $O_2$, power 350 W, 660 mTorr). However, a person skilled in the art will appreciate that any conditions suitable to remove a polyimide sacrificial layer may be envisaged. For example, the polyimide sacrificial layer may be removed by using high temperature direct wafer heating and a nitrogen doped oxygen plasma. If alternative plasma tools are employed e.g. low-temperature microwave assisted plasma etchers, an additional 150-200 degree C. anneal step may be required to control and finalise the aluminium stress.

Finally at a step s119, the finished MEMS microphones are manually removed from the dicing tape using a vacuum pad and mounted in a package 1108 as shown in FIG. 8. Alternatively, this is achieved using an automated pick and place system. The package 1108 may be any package suitable for electrical connection to any device operable to interface with the microphone.

In order to ensure compatibility with CMOS processes, it is important to restrict the maximum temperature the device is subjected to throughout the fabrication process. For example, the maximum fabrication temperature may be restricted to below 400° C.

A schematic plan view of a MEMS microphone according to the first embodiment described above is shown in FIG. 8. A microphone chip 1000 is stuck to a chip mounting area 1003 on the package 1008 with a suitable adhesive. A microphone 1002 is operably connected to circuit areas 11 to chip contact pads 1006 on the microphone chip 1000. The chip contact pads 1006 are wire bonded to package contact pads 1007 in a package contact pad area 1004 using electrically conductive wires 1001. For example, the electrically conductive wires 1001 may be gold. Alternatively, they may be aluminium. However, a person skilled in the art will realise that any material suitable for wire bonding may be used to electrically connect the chip contact pads 1006 to the package contact pads 1007. The package contact pads are operably connected to package contacts 1009 to enable the package to be operably connected to a printed circuit board. Although the package 1008 has eight package contacts 1009, a person skilled in the art will realise that any number of package contacts 1009 and package contact pads 1007 may be provided in the package 1008.

Typical dimensions of the microphone are: diameter ~1 mm, membrane thickness (see below) ~0.3-1 micron, electrodes ~0.1 micron thick, backplate ~2-5 micron thick.

A person skilled in the art will appreciate that the above description of the first preferred embodiment is not limited to the fabrication of MEMS microphones. For example, the method described in the embodiment above may be modified so that step s17, where a hole is etched in the underside of the substrate, is omitted from the process so as to fabricate an ultrasonic transducer. Without the backhole the backplate and electrode 18 effectively becomes the membrane. With an appropriate choice of dimensions (preferably thinner than the dimensions set out above) this backplate/electrode arrangement can be driven as an ultrasonic transducer. Re-sealing of the holes would allow operation also as an immersion transducer. Again without the backhole and with re-sealed membranes the capacitance will become sensitive to absolute pressure rather than differential pressure. Furthermore, the method described in the embodiment above may be used to fabricate a pressure sensor or fabricate an array on a substrate, the array comprising any or all of: a microphone; an ultrasonic transducer; and a pressure sensor. The array, combined with appropriate electronics and signal processing, could provide a directionally selective microphone.

A method for the fabrication of a device according to the second embodiment is substantially the same as hereinbefore described for the first embodiment with reference to FIG. 6 and FIGS. 7a to 7e and with reference to elements as disclosed above. However, for the second embodiment, the stress release holes are etched through the membrane using the Plasmatherm RIE machine. This takes place between step s115 and step s116. Preferable process parameters for this procedure are a power of 750 W and 60 mTorr pressure. Preferably, the gases flowed through the process chamber of the RIE machine are $CF_4$ at 60 sccm and $H_2$ at 10 sccm. However, it will be appreciated by a person skilled in the art that other process parameters may be envisaged.

One method to fabricate the perimeter cavity 225 according to the second embodiment is to employ anhydrous HF vapour etching to etch the silica and thus form the cavity. This may take place after the step s116 of etching the back-hole through the silicon. The anhydrous HF vapour will isotropically etch the silica. The cavity size is dependent on the length of time that etching is carried out and so the etch time is selected to form a suitably sized cavity. In this embodiment, the electrode materials are chosen to be resistant to HF. For example, AlSi may be used as the electrode material. It will be obvious to a person skilled in the art that other process sequences that achieve the same goal may be envisaged. It will also be appreciated by a person skilled in the art that the second embodiment may be mounted in a package as shown in FIG. 8 and in a similar manner as that described for the first embodiment.

A person skilled in the art will appreciate that the above description of the second preferred embodiment is not limited to the fabrication of MEMS microphones. For example, the method described in the embodiment above may be modified so that step s17, where a hole is etched in the underside of the substrate, is omitted from the process so as to fabricate an ultrasonic transducer. Without the backhole the backplate and electrode 18 effectively becomes the membrane. With an appropriate choice of dimensions (preferably thinner than the dimensions set out above) this backplate/electrode arrangement can be driven as an ultrasonic transducer. Re-sealing of the holes would allow operation also as an immersion transducer. Furthermore, the method described for the second embodiment above may be used to fabricate an array on a substrate, the array comprising any or all of: a microphone; and an ultrasonic transducer. The array, combined with appropriate electronics and signal processing could provide a directionally selective microphone.

A method for the fabrication of a device according to the third embodiment is substantially the same as hereinbefore described for the first embodiment with reference to FIG. 6 and FIGS. 7a to 7e and with reference to elements as disclosed above. Here, before step s112 where the bottom electrode is deposited, a thick layer of polyimide is spun onto the substrate. It is then patterned using photolithography and patterned so as to form the complex stress relieving structure on which the membrane and backplate are fabricated. It will also be appreciated by a person skilled in the art that the third embodiment may be mounted in a package as shown in FIG. 8 and in a similar manner as that described for the first embodiment.

It will be appreciated by a person skilled in the art that any or all of the features described in the above embodiments may be combined so as to reduce a temperature sensitivity of a MEMS device. Furthermore, the methods described above to fabricate the above embodiments may be used to fabricate an array on a substrate, the array comprising any or all of: a microphone according to the first embodiment; an ultrasonic transducer according to the first embodiment; a pressure sensor according to the first embodiment; a microphone according to the second embodiment; an ultrasonic transducer according to the second embodiment; and a microphone according to the third embodiment.

References

1. A. E. Kabir, R. Bashir, J. Bernstein, J. De Santis, R. Mathews, J. O. O'Boyle and C. Bracken "High sensitivity acoustic transducers with thin P+ membranes and gold back-plate", Sensors and Actuators-A, Vol. 78, issue 2-3, pp. 138-142, 17 Dec. 1999.
2. P. R. Scheeper, W. Olthuis & P. Bergveld "A Silicon condenser microphone with a silicon nitride diaphragm and backplate", J. Micromech. Microeng. 2 (1992) pgs. 187-189.
3. M. Pedersen, W. Olthuis and P. Bergveld, "High-performance condenser microphone with fully integrated CMOS amplifier and DC-DC voltage converter", Journal of Microelectromechanical Systems, Vol. 7, No. 4, December 1998, pg. 387.
4. B. T. Cunningham and J. J. Bernstein, "Wide bandwidth silicon nitride membrane microphones", Proc. SPIE Vol. 3223, pg. 56.
5. P. V. Loeppert and M. Pederson, "Miniature broadband acoustic transducer" U.S. Pat. No. 6,535,460

The invention claimed is:

1. A micro-electrical-mechanical device comprising:
   a transducer arrangement comprising a membrane and a substrate;
   electrical interface means for relating electrical signals to movement of the membrane;
   a substrate hole formed through the substrate, across which the membrane is suspended; and
   a stress release region comprising stress alleviating formations within the perimeter of the membrane which at least partially decouple the membrane from expansion or contraction of the substrate, wherein the stress alleviating formations comprise holes or trenches in the membrane, wherein the membrane is mounted with respect to the substrate such that the stress release region at least partially overlaps with the substrate so as to damp air flow through the membrane and the substrate hole formed in the substrate via a perimeter cavity formed below the stress release region.

2. A device according to claim 1, wherein the transducer arrangement further comprises a back-plate arrangement having another electrical interface means for relating electrical signals to the movement of the membrane, the back-plate arrangement being positioned so as to form a cavity between the back-plate arrangement and the membrane.

3. A device according to claim 2, in which the cavity is formed by removal of a sacrificial layer.

4. A device according to claim 3, in which the sacrificial layer is polyimide.

5. A device according to claim 3, in which the sacrificial layer is low temperature silica.

6. A device according to claim 3, in which the removal of the sacrificial layer is carried out using dry etching.

7. A device according to claim 6, wherein said dry etching comprises oxygen plasma etching.

8. A device according to claim 7, in which the plasma is partially induced by microwaves.

9. A device according to claim 3, in which the removal of a sacrificial layer is carried out using high temperature direct wafer heating and a nitrogen doped oxygen plasma.

10. A device according to claim 2, in which the back-plate arrangement is perforated so as to allow a passage of air through it.

11. A device according to claim 1, in which the stress alleviating formations are disposed substantially between the transducer arrangement and the substrate.

12. A device according to claim 11, in which a stiffness of the stress alleviating formations substantially perpendicular to the substrate is greater than a stiffness of the stress alleviating formations substantially in the plane of the substrate.

13. A device according to claim 1, in which the device is fabricated in a process in which the temperature does not exceed 400° C.

14. A device according to claim 1, in which the membrane is silicon nitride.

15. A device according to claim 1, in which the electrical interface means comprise one or more materials selected from the list consisting of: Al, AlSi; AlSiCu; Ti, TiW; Cu, Ni, NiCr; Pt, Ta, and Pd.

16. A device according to claim 1, in which the substrate is silicon.

17. A MEMS microphone comprising a device according to claim 1.

18. A MEMS pressure sensor comprising a device according to claim 1.

19. A MEMS ultrasonic transducer comprising a device according to claim 1.

20. An array of MEMS devices disposed upon an integrated circuit substrate, the devices being operably connected and the devices being selected from a list comprising:
   a MEMS microphone comprising a device according to claim 1;
   a MEMS pressure sensor comprising a device according to claim 1; and
   a MEMS ultrasonic transducer comprising a device according to claim 1.

21. A device according to claim 20, wherein the integrated circuit substrate is the same as the substrate.

22. An integrated circuit substrate on which an electronic circuit operably connected to the device according to claim 1 is formed.

23. A device according to claim 22, wherein the integrated circuit substrate is the same as the substrate.

24. A packaged integrated circuit arrangement comprising the integrated circuit substrate according to claim 22, mounted in an integrated circuit package.

25. A device according to claim 1, the device further comprising a covering layer which covers one or more of said holes or trenches in the membrane.

* * * * *

UNITED STATES PATENT AND TRADEMARK OFFICE
CERTIFICATE OF CORRECTION

PATENT NO.      : 8,643,129 B2                                          Page 1 of 1
APPLICATION NO. : 12/293537
DATED           : February 4, 2014
INVENTOR(S)     : Laming et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 521 days.

Signed and Sealed this

Twenty-ninth Day of September, 2015

Michelle K. Lee
*Director of the United States Patent and Trademark Office*